(12) United States Patent
Sher et al.

(10) Patent No.: US 6,351,180 B1
(45) Date of Patent: Feb. 26, 2002

(54) CLAMP CIRCUIT WITH FUSE OPTIONS

(75) Inventors: Joseph C. Sher, Meridian; Daniel R. Loughmiller, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/387,263

(22) Filed: Aug. 31, 1999

(51) Int. Cl.[7] .............................. G05F 1/10; G05F 3/02
(52) U.S. Cl. ....................................... 327/541; 327/525
(58) Field of Search ................................ 327/538, 540, 327/541, 525

(56) References Cited

U.S. PATENT DOCUMENTS

| | | | | |
|---|---|---|---|---|
| 4,585,955 A | * | 4/1986 | Uchida | 327/541 |
| 5,473,277 A | * | 12/1995 | Furumochi | 327/543 |
| 5,483,486 A | * | 1/1996 | Javanifard et al. | 365/185.17 |
| 5,602,790 A | * | 2/1997 | Mullarkey | 365/211 |
| 5,969,565 A | * | 10/1999 | Naganawa | 327/536 |

* cited by examiner

Primary Examiner—Toan Tran
Assistant Examiner—Quan Tra
(74) Attorney, Agent, or Firm—Knobbe,. Martens, Olson & Bear, LLP (57) ABSTRACT

A voltage control circuit provides a test supply voltage during manufacturing and testing of a semiconductor device and provides an operational supply voltage after certification of the semiconductor device. The operational supply voltage is lower than the test supply voltage. The voltage control circuit includes a clamp circuit having a plurality of voltage regulation devices, typically diodes. The voltage regulation devices control an output of the clamp circuit. A voltage regulator is electrically coupled to the clamp circuit and generates a first control signal based upon the output of the clamp circuit. A charge pump then receives the control signal from the voltage regulator, and, based on the value of the control signal, the charge pump generates the test supply voltage. At least one bypass device is connected to at least one of the plurality of voltage regulation devices. The bypass device is activated following the certification of the semiconductor device. Once activated, the bypass device bypasses the respective voltage regulation device from the clamp circuit, which limits the output of the clamp circuit. The voltage regulator then generates a second control signal based upon the limited output of the clamp circuit. The second control signal is provided to the charge pump to generate the operational supply voltage.

21 Claims, 7 Drawing Sheets

CLAMP CIRCUIT WITH FUSE OPTIONS

BACKGROUND OF THE INVENTION

1. Field of the Invention

The present invention relates generally to semiconductor integrated circuits. More specifically, the present invention relates to differential voltage regulators used in semiconductor devices

2. Description of the Related Art

A semiconductor device may be designed for any of a wide variety of applications. Typically, the device includes logic circuitry to receive, manipulate or store input data. The circuitry subsequently generates the same or modified data at an output terminal of the device. Depending on the type of semiconductor device or the circuit in which it is used, the device typically includes circuits which provide internal power signals that are regulated to be substantially independent of fluctuations in the externally generated power input signal.

An example of a data storage or memory device having such internal power signal circuits is the DRAM (dynamic random access memory). Conventionally, the DRAM receives an external power signal ($V_{CCX}$) having a voltage intended to remain constant, for example, at 4.5 volts measured relative to ground. Internal to the DRAM, the power regulation circuit maintains an internal operating voltage signal ($V_{CC}$) at a designated level, for example, 2.5 volts. Ideally, $V_{CC}$ linearly tracks $V_{CCX}$ from zero volts to the internal operating voltage level, at which point $V_{CC}$ remains constant as $V_{CCX}$ continues to increase in voltage to the designated $V_{CCX}$ level.

DRAMs also typically include a regulated constant pumped supply voltage ($V_{CCP}$) which is greater than $V_{CC}$, for example, four volts. Conventionally, the pumped voltage drives the word lines of a DRAM. The DRAM has memory arrays comprising a number of intersecting row and column lines of individual transistors or memory cells. The pumped voltage needs to be greater than $V_{CC}$ to ensure that memory access operations, such as a memory cell read or a memory cell write, are performed both completely and quickly. Ideally, $V_{CCP}$ does not fluctuate. If $V_{CCP}$ is too high, damage to the memory cells may result. If it is too low, the memory chip may have poor data retention or may otherwise operate incorrectly. Depending on the type of memory device, the device may include a second circuit for providing this internal regulated pumped power signal.

Previously implemented CMOS (complementary metal-oxide semiconductor) power regulation circuits for regulating $V_{CCP}$ include an input stage comprising a series of diodes and an inverter circuit having a "trip point" to trigger the point at which the inverter circuit activates the charge pump for $V_{CCP}$. The series of diodes, which are implemented through a combination of PMOS/NMOS (p-channel MOS/n-channel MOS) transistors, are used to translate the $V_{CCP}$ signal down to the input trip point range for controlling the inverter circuit. The inverter circuit provides an output signal which drives an amplifier (implemented as a series of inverters) to bring the output signal to full CMOS levels.

Semiconductor devices are typically tested extensively by the manufacturer at pre-set voltage levels prior to shipping. These tests are performed under controlled conditions and high $V_{CCP}$ voltage levels may be used to ensure the devices are operating properly. However, some customers may choose to perform their own reliability tests on the devices once they are received. Because the customers' tests are not always performed under the proper conditions, high $V_{CCP}$ voltage levels used during these tests may damage the semiconductor devices due to over-stress. The damaged devices will then fail the reliability tests, even though the device was operating properly when shipped.

What is desired is a circuit that generates a high $V_{CCP}$ voltage level on a semiconductor device for use during testing by the manufacturer, but then limits the $V_{CCP}$ voltage level the circuit generates once the device is shipped. This prevents a customer from inadvertently damaging the device by applying an over-voltage outside of controlled conditions.

SUMMARY OF THE INVENTION

The present invention involves limiting the supply voltage of a semiconductor device after the manufacturer's testing is complete. The testing of the semiconductor device is accomplished under controlled conditions. A voltage control circuit limits the maximum supply voltage to a first level during testing of the device using a plurality of voltage regulation devices. The maximum supply voltage available during testing is high enough to cause damage to the semiconductor device if the voltage is applied under non-controlled conditions. To prevent a customer from damaging the semiconductor device, the voltage control circuit reduces the maximum supply voltage to a non-harmful level prior to shipping. This allows the customer to perform its own reliability tests without damaging the device. The voltage control circuit uses fuses to limit the maximum supply voltage. After the manufacturer's testing is completed, the maximum supply voltage is limited by blowing fuses to bypass some of the voltage regulation devices.

One aspect of the invention is a voltage control circuit which provides a test supply voltage during manufacturing and testing of a semiconductor device and which provides an operational supply voltage after certification of the semiconductor device. The operational supply voltage is lower than the test supply voltage. The voltage control circuit includes a clamp circuit having a plurality of voltage regulation devices. The voltage regulation devices control a clamping threshold of the clamp circuit. A voltage regulator is electrically coupled to the clamp circuit and generates a first control signal responsive to the clamping threshold of the clamp circuit. A charge pump then receives the control signal from the voltage regulator, and, based on the value of the control signal, the charge pump generates the test supply voltage. At least one bypass device is connected to at least one of the plurality of voltage regulation devices. The bypass device is activated following the certification of the semiconductor device. Once activated, the bypass device bypasses the respective voltage regulation device from the clamp circuit to lower the clamping threshold of the clamp circuit. The voltage regulator then generates a second control signal responsive to the lowered clamping threshold of the clamp circuit. The second control signal is provided to the charge pump to generate the operational supply voltage. In one embodiment, the plurality of voltage regulation devices comprise diodes, which may be implemented through transistors. The bypass device may include a fuse.

Another aspect of the invention is a method of providing a first supply voltage on a semiconductor device during a first period and a second supply voltage during a second period. The method comprises the steps of providing a plurality of voltage control elements and establishing a first voltage control signal from the voltage control elements.

The first supply voltage is then generated from the first voltage control signal. The method further comprises bypassing at least one of the voltage control elements and establishing a second voltage control signal from the voltage control elements which are not bypassed. The second supply voltage is then generated from the second voltage control signal. The first supply voltage has a voltage magnitude greater than the second supply voltages.

Another aspect of the invention is a voltage control circuit comprising a plurality of voltage regulation devices which limit an output voltage generated from an input voltage. A voltage regulation circuit receives the output voltage and generates a corresponding control signal. A charge pump receives the control signal and adjusts the voltage of a supply voltage based on the control signal. At least one voltage limiting device is coupled to a corresponding voltage regulation device. Each voltage limiting device is capable of selectively bypassing a corresponding voltage regulation device to further limit the output voltage, thereby reducing the voltage of the supply voltage.

Another aspect of the invention is a method of controlling a supply voltage in a semiconductor device. The method comprises the steps of providing an input voltage to a voltage regulator and establishing a target voltage of the input voltage. A reference voltage is adjusted when the input voltage reaches the target voltage. The method further comprises setting a control signal based on the reference voltage and generating the supply voltage based on the control signal. The target voltage is then decreased to limit the voltage level of the supply voltage.

Another aspect of the invention is a voltage control circuit which provides a test supply voltage during manufacturing and testing of a semiconductor device and an operational supply voltage after certification of the semiconductor device. The operational supply voltage is lower than the test supply voltage. The voltage control circuit comprises means for controlling an output of a clamp circuit and means for generating a first control signal based upon the output of the clamp circuit. The voltage control circuit further comprises a means for generating the test supply voltage and a means for limiting the output of the clamp circuit. A means for generating a second control signal is based upon the limited output of the clamp circuit. The limited output of the clamp circuit is then used to generate the operational supply voltage.

BRIEF DESCRIPTION OF THE DRAWINGS

These and other features and advantages of the invention will become more apparent upon reading the following detailed description and upon reference to the accompanying drawings, in which;

FIG. 3, consisting of FIGS. 3A and 3B, is a schematic diagram of the $V_{CCP}$ Regulator circuit of FIG. 2;

FIG. 4, consisting of FIGS. 4A and 4B, is a schematic diagram of the $V_{CCP}$ Regulator circuit of FIG. 3 including fuse options according to the present invention.

DETAILED DESCRIPTION OF THE PREFERRED EMBODIMENT

Figure 1:
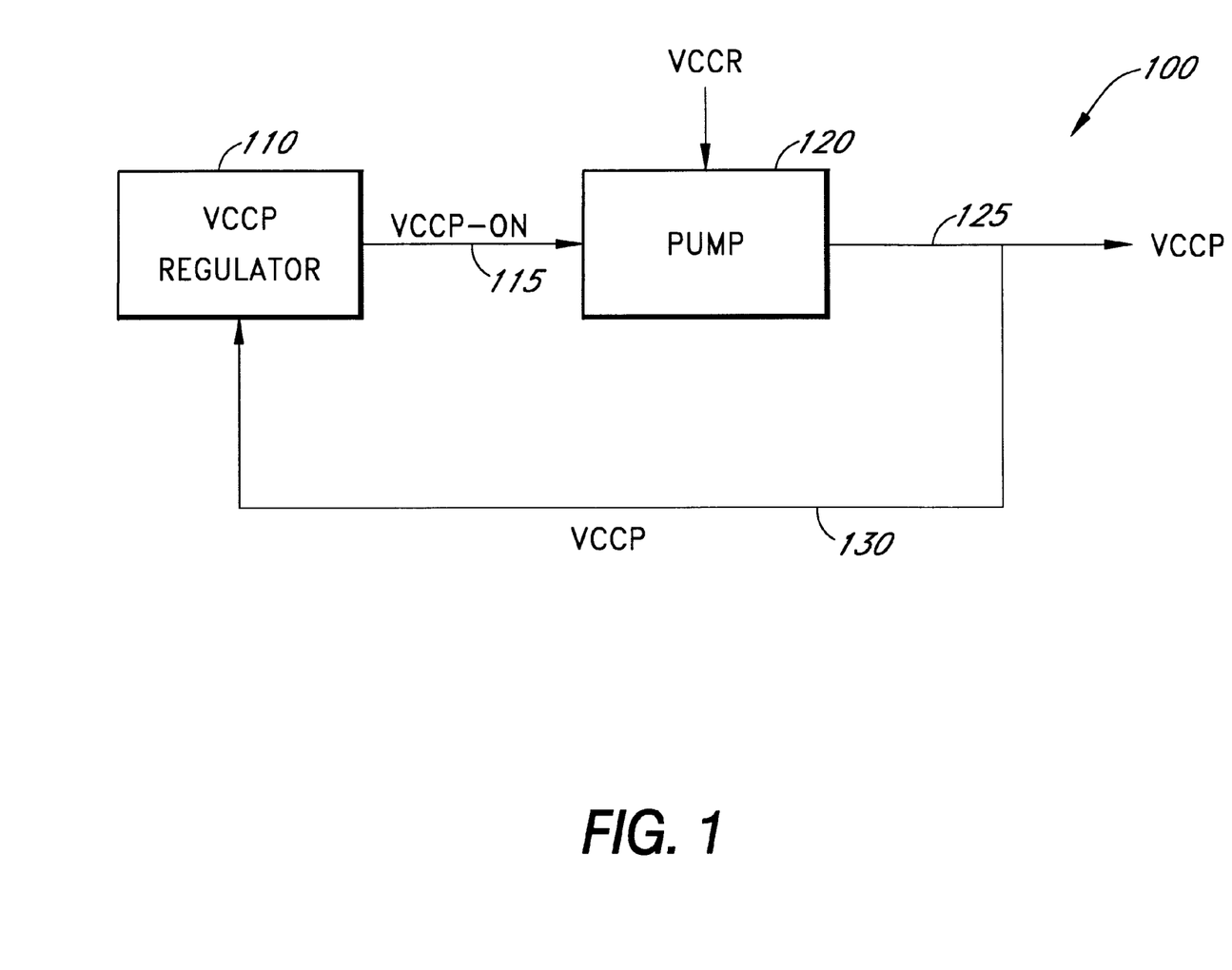
FIG. 1 is a block diagram illustrating a voltage circuit according to the teaching of the present invention.

FIG. 1 is a block diagram illustrating a voltage control circuit 100 according to the present invention. The voltage control circuit 100 includes a $V_{CCP}$ regulator 110, a charge pump 120, and a feedback signal line 130. The $V_{CCP}$ regulator 110 generates an output signal $V_{CCP-ON}$ 115 which controls the charge pump 120. The charge pump 120 receives two inputs, a regulated voltage $V_{CCR}$ and the output signal $V_{CCP-ON}$ from the $V_{CCP}$ regulator 110. The output 125 of the charge pump 120 is the voltage $V_{CCP}$. The voltage $V_{CCP}$ is fed back to as input to the $V_{CCP}$ regulator by the feedback signal line 130.

The value of the signal $V_{CCP-ON}$ 115 controls the operation of the charge pump 120. When $V_{CCP}$ is below the desired level, the signal $V_{CCP-ON}$ 115 causes the charge pump 120 to turn on, thereby increasing the value of $V_{CCP}$. When $V_{CCP}$ is above the desired level, the signal $V_{CCP-ON}$ causes the charge pump 120 to turn off, thereby decreasing the value of $V_{CCP}$. The charge pump 120 generates $V_{CCP}$ at a value of approximately 1.5 volts above $V_{CCR}$ so that $V_{CCP}$ tracks $V_{CCR}$ as $V_{CCR}$ increases and decreases. The charge pump 120 is conventional and may be implemented using any of a number of circuits.

Figure 2:
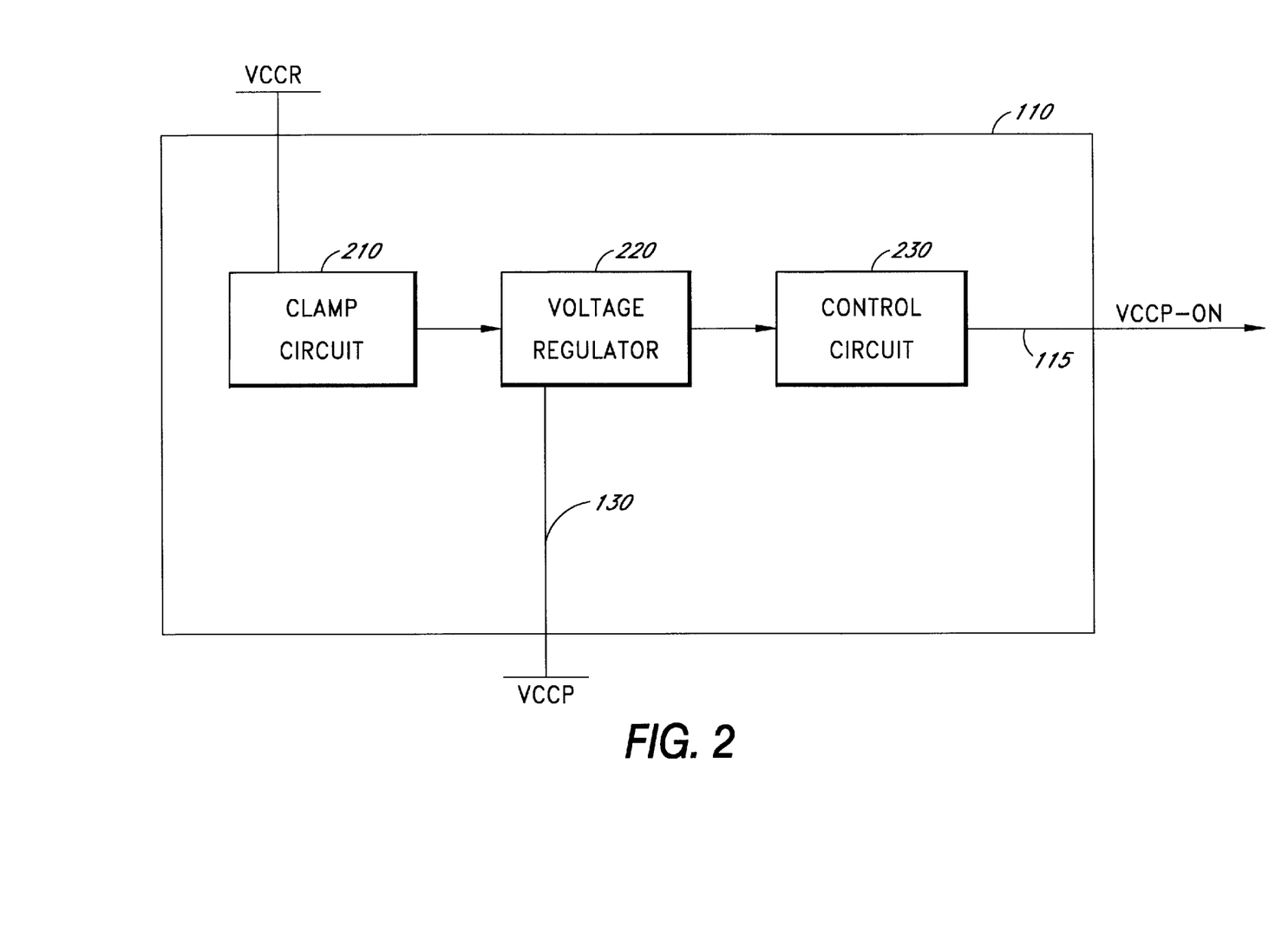
FIG. 2 is a block diagram illustrating in detail the $V_{CCP}$ regulator circuit of FIG. 1.

FIG. 2 further illustrates the $V_{CCP}$ regulator 110 of FIG. 1. The $V_{CCP}$ regulator 110 includes a clamp circuit 210, a voltage regulator 220, and a control circuit 230. The clamp circuit 210 is used to place an upper limit on $V_{CCP}$ as $V_{CCP}$ increases. In particular, as discussed below, when $V_{CCP}$ increases above a predetermined limit, the clamp circuit reduces the difference between $V_{CCP}$ and $V_{CCR}$. The voltage regulator 220 provides an output signal which drives the control circuit 230 to generate the signal $V_{CCP-ON}$ 115.

Figures 3, 3A:
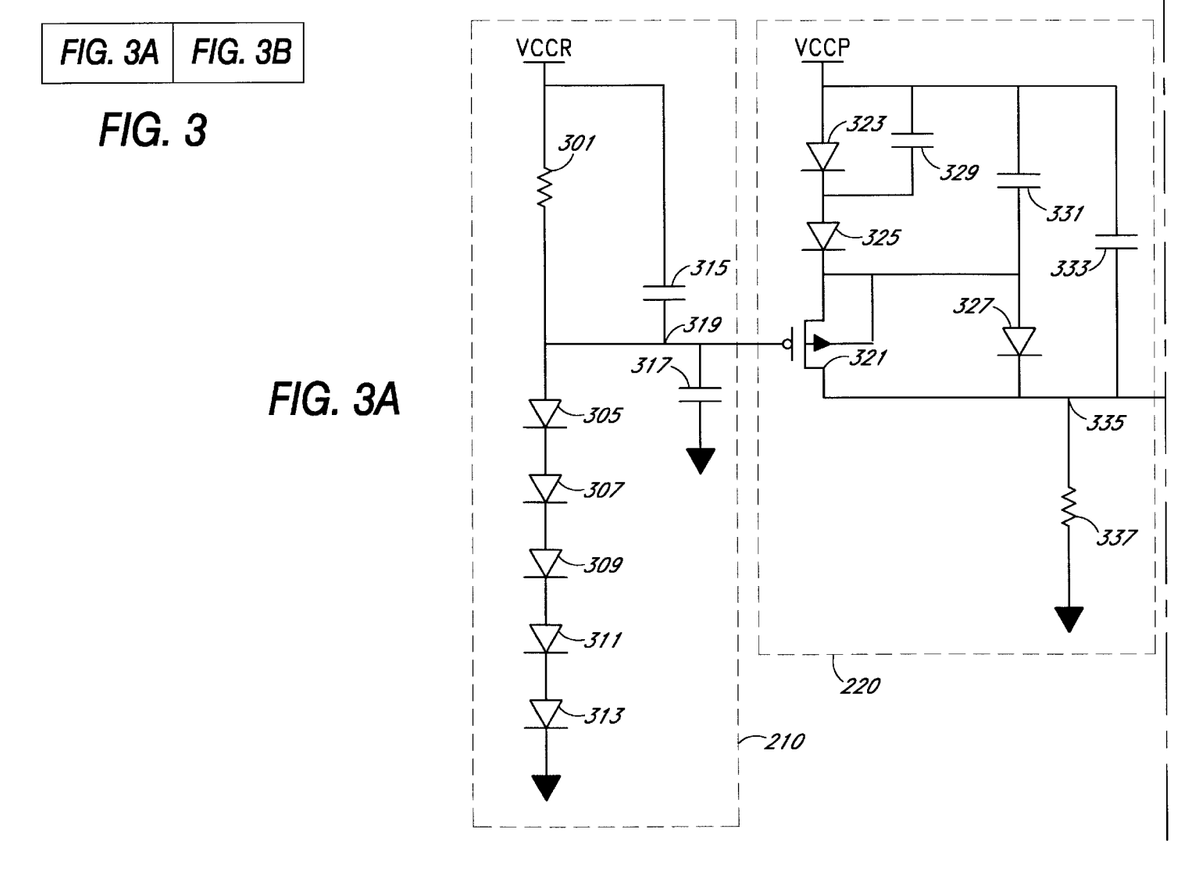

FIG. 3 (comprising FIGS. 3A and 3B) is a schematic diagram of the $V_{CCP}$ regulator circuit of FIG. 2. The clamp circuit 210 comprises a resistor 301, capacitors 315 and 317, and diodes 305, 307, 309, 311, and 313. A first terminal of the resistor 301 is connected to a regulated voltage $V_{CCR}$. A second terminal of the resistor 301 is connected a node 319, to an anode of the diode 305, to a first terminal of the capacitor 315, and to a first terminal of the capacitor 317. A cathode of the diode 305 is connected to an anode of the diode 307. A cathode of the diode 307 is connected to an anode of the diode 309. A cathode of the diode 309 is connected to an anode of the diode 311. A cathode of the diode 311 is connected to an anode of the diode 313. A cathode of the diode 313 is connected to ground. A second terminal of the capacitor 315 is connected to the regulated voltage $V_{CCR}$. A second terminal of the capacitor 317 is connected to ground. The node 319 is connected to the gate of a transistor 321.

Figure 3B:
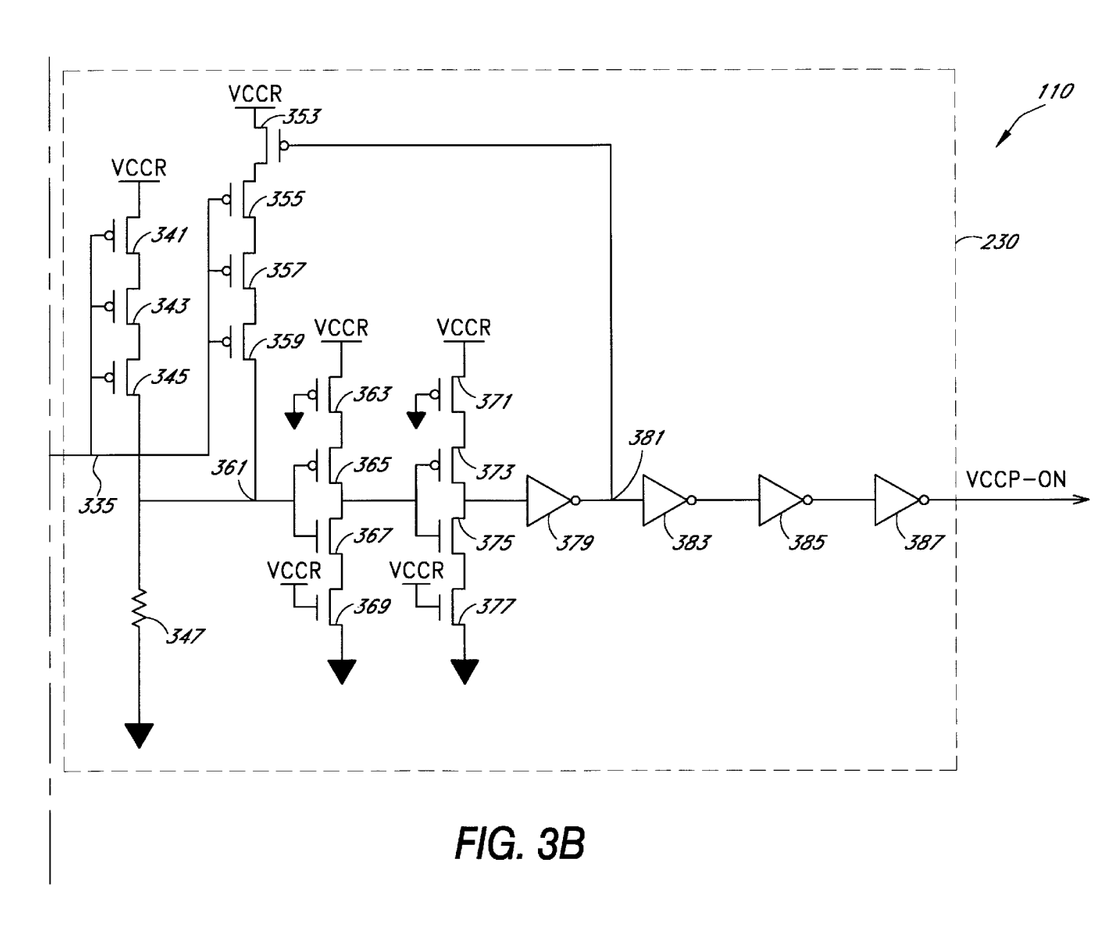

The voltage regulator 220 comprises a resistor 337, capacitors 329, 331, and 333, diodes 323, 325, and 327, and the transistor 321. An anode of the diode 323 is connected to the pumped supply voltage $V_{CCP}$, to a first terminal of the capacitor 329, to a first terminal of the capacitor 331, and to a first terminal of the capacitor 333. A cathode of the diode 323 is connected to an anode of the diode 325 and to a second terminal of the capacitor 329. A cathode of the diode 325 is connected to a drain of the transistor 321, to a second terminal of the capacitor 331, and to an anode of the diode 327. A cathode of the diode 327 is connected to a source of the transistor 321, to a first terminal of the resistor 337, to a second terminal of the capacitor 333, and to a node 335. A second terminal of the resistor 337 is connected to ground. The node 335 is connected to the control circuit 230 (FIG. 3B).

The control circuit 230 comprises a resistor 347, transistors 341, 343, 345, 353, 355, 357, 359, 363, 365, 367, 369, 371, 373, 375, and 377, and inverters 379, 383, 385, and 387. The gates of the transistors 341, 343, 345, 355, 357, and 359 are connected together and are connected to the node 335 from the voltage regulator 220. A drain of the transistor 341 is connected to the regulated voltage $V_{CCR}$. A source of the transistor 341 is connected to a drain of the transistor 343. A source of the transistor 343 is connected to a drain of the transistor 345. A source of the transistor 343 is connected to a first terminal of the resistor 347, to a source of the transistor 359, to a gate of the transistor 365, and to a gate of the transistor 367 at a node 361. A second terminal of the resistor 347 is connected to ground.

A drain of the transistor 353 is connected to the regulated voltage $V_{CCR}$. A source of the transistor 353 is connected to a drain of the transistor 355. A source of the transistor 355 is connected to a drain of the transistor 357. A source of the transistor 357 is connected to a drain of the transistor 359.

A drain of the transistor 363 is connected to the regulated voltage $V_{CCR}$. A source of the transistor 363 is connected to a drain of the transistor 365. A source of the transistor 365 is connected a gate of the transistor 373, to a gate of the transistor 375, and to a drain of the transistor 367. A source of the transistor 367 is connected to a drain of the transistor 369. A source of the transistor 369 is connected to ground. A gate of the transistor 363 is connected to ground. A gate of the transistor 369 is connected to the regulated voltage $V_{CCR}$.

A drain of the transistor 371 is connected to the regulated voltage $V_{CCR}$. A source of the transistor 371 is connected to a drain of the transistor 373. A source of the transistor 373 is connected an input terminal of the inverter 379 and to a drain of the transistor 375. A source of the transistor 375 is connected to a drain of the transistor 377. A source of the transistor 377 is connected to ground. A gate of the transistor 371 is connected to ground. A gate of the transistor 377 is connected to the regulated voltage $V_{CCR}$.

An output terminal of the inverter 379 is connected to the gate of the transistor 353 and to an input terminal of the inverter 383. An output terminal of the inverter 383 is connected to an input terminal of the inverter 385. An output terminal of the inverter 385 is connected to an input terminal of the inverter 387. An output terminal of the inverter 387 provides the output $V_{CCP-ON}$.

The voltage regulator controls the voltage difference between $V_{CCP}$ and the node 335. When the voltage at the node 319 is high relative to the drain of the transistor 321, and therefore the transistor 321 is off, the diodes 323, 325, and 327 connect $V_{CCP}$ to the node 335. Therefore, the voltage across the resistor 337 at the node 335 is approximately $3V_T$ below $V_{CCP}$, or approximately 2.1 volts below $V_{CCP}$. As $V_{CCR}$ increases, the clamp circuit 210 turns on the transistor 321 as described below, thereby gradually bypassing the diode 327. When the transistor 321 is fully turned on, the voltage across the resistor 337 at the node 335 is only two diode drops below $V_{CCP}$, or approximately 1.4 volts below $V_{CCP}$. This increases the voltage at the node 335 relative to $V_{CCP}$, and therefore increases the voltage at the node 335 relative to $V_{CCR}$. As discussed below, when the voltage at the node 335 is increased relative to $V_{CCR}$, the control circuit 230 generates an output signal to turn off the charge pump 120, thereby reducing the value of $V_{CCP}$.

The capacitors 329, 331, and 333 help bring the voltage at the node 335 to a higher level when the voltage of $V_{CCP}$ changes rapidly. When $V_{CCP}$ increases, the voltage at the node 335 rises through the three diodes 323, 325, and 327. The capacitors 329, 331, and 333 cause the voltages on the anodes of the three diodes 323, 325, and 327 to increase faster than if the capacitors 329, 331, and 333 were not present.

The control circuit 230 detects the voltage present across the resistor 337 at the node 335 and then generates the appropriate $V_{CCP-ON}$ output signal necessary to control the $V_{CCP}$ charge pump. As the voltage $V_{CCP}$ increases, the voltage at the node 335 increases. The transistors 341, 343, 345, 355, 357, and 359 effectively operate as variable resistors controlled by the voltage on the node 335. Increasing the voltage at the node 335 turns off the transistors 341, 343, 345, 355, 357, and 359 further, thereby increasing the overall resistance of the transistors 341, 343, 345, 355, 357, and 359. Increasing this resistance decreases the voltage across the resistor 347 at the node 361. When the voltage at the node 361 decreases, the transistor 365 turns on and the transistor 367 turns off. This allows current to flow through the transistor 363 and the transistor 365 to raise the voltage at the gates of the transistors 373 and 375. The voltage at the gates of the transistors 373 and 375 is greater in magnitude than the voltage at the gates of the transistors 365 and 367, but remain between $V_{CCR}$ and ground. This increased voltage turns off the transistor 373 and turns on the transistor 375. With the transistor 375 on, current flows through the transistors 377 and 375 to bring the voltage at the input to the inverter 379 to ground, or low. The transistor 365 and the transistor 375 thus operate as an amplifier to convert the relatively small decrease in voltage at the node 335 to a full voltage swing to ground on the input to the inverter 379.

With ground on the input to the inverter 379, the inverter 379 outputs a high voltage, which is used as an input to the inverter 383 and as part of a feedback loop to the gate of the transistor 353. The inverter 383 outputs a low voltage, which is received at the input of the inverter 385, which outputs a high voltage. The inverter 385 outputs a high voltage, which is received at the input of the inverter 387. The inverter 387 then outputs a low voltage, or ground, as the control signal $V_{CCP-ON}$. The control signal $V_{CCP-ON}$ is an input to the charge pump 120. Because the control signal $V_{CCP-ON}$ is low, the charge pump 120 turns off to decrease the value of $V_{CCP}$ $V_{CCP}$ is also increased in a similar manner. As the voltage of $V_{CCP}$ decreases, the voltage at the node 335 decreases. Decreasing the voltage at the node 335 to a threshold voltage slowly turns on the transistors 341, 343, 345, 355, 357, and 359, thereby decreasing the overall resistance of the transistors 341, 343, 345, 355, 357, and 359. Decreasing this resistance increases the voltage across the resistor 347 at the node 361. When the voltage at the node 361 increases, the transistor 365 turns off and the transistor 367 turns on. This allows current to flow through the transistor 367 and the transistor 369 to lower the voltage at the gates of the transistors 373 and 375. This decreased voltage turns on the transistor 373 and turns off the transistor 375. With the transistor 373 on, current flows through the transistor 371 and 373 to increase the voltage at the input to the inverter to a higher level. The transistor 367 and the transistor 373 thus operate as an amplifier to convert the relatively small increase in voltage at the node 335 to a full voltage swing to $V_{CCR}$ on the input to the inverter 379.

With $V_{CCR}$ on the input to the inverter 379, the inverter 379 outputs a low voltage, which is used as an input to the inverter 383 and as part of a feedback loop to the gate of the transistor 353. The inverter 383 outputs a high voltage, which is received at the input of the inverter 385, which outputs a low voltage. The inverter 385 outputs a low voltage, which is received at the input of the inverter 387. The inverter 387 then outputs a high voltage as the control signal $V_{CCP-ON}$. The control signal $V_{CCP-ON}$ is an input to the charge pump 120. Because the control signal $V_{CCP-ON}$ is high, the charge pump 120 turns on to increase the value of $V_{CCP}$.

The feedback signal at the node 381 turns on the transistor 353 when the control signal $V_{CCP-ON}$ is high. This causes the transistors 355, 357, and 359 to be connected in parallel with the transistors 341, 343, and 345 when the control signal $V_{CCP-ON}$ is active high. When the control signal $V_{CCP-ON}$ is low, the feedback signal at the node 381 turns off the transistor 353 which causes the transistors 341, 343, and 345 to be disconnected from the circuit. Because the transistors 355, 357, and 359 operate as variable resistors in parallel with the transistors 341, 343, and 345, removing the transistors 355, 357, and 359 from the circuit increases the overall resistance of the parallel combination. Thus, as the voltage on the node 335 decreases when the control signal $V_{CCP-ON}$ is low, the resistance of the parallel combination decreases by a smaller amount than if the transistors 355, 357, and 359 were in the circuit. Thus, the voltage at the node 335 must go lower with respect to $V_{CCR}$ before the voltage across the resistor 347 at the node 361 changes the state of the transistors 365 and 367. Therefore, as $V_{CCP}$ decreases, the control circuit 230 generates the control signal $V_{CCP-ON}$ to turn on the charge pump 120 at a voltage lower than the voltage necessary to generate the control signal $V_{CCP-ON}$ to turn off the charge pump 120. When the control signal $V_{CCP-ON}$ is high to turn on the charge pump 120, the feedback signal 381 is low. This turns on the transistor 353, and places the transistors 355, 357, and 359 back in parallel with the transistors 341, 343, and 345. Thus, as the voltage on the node 335 increases, the resistance of the parallel combination increases by a smaller amount than when the transistors 355, 357, and 359 are disconnected from the circuit. Thus, the voltage at the node 335 must go higher with respect to $V_{CCR}$ before the voltage across the resistor 347 at the node 361 changes the state of the transistors 365 and 367. The feedback signal 381 therefore alters the voltage necessary to change the state of the transistors 365 and 367 and maintains a relatively constant voltage of $V_{CCP}$ using hysteresis.

As described above, the voltage control circuit 100 maintains the voltage of $V_{CCP}$ by continually switching the charge pump 120 on and off. The control circuit 100 uses hysteresis to maintain a relatively constant voltage of $V_{CCP}$. For example, if the voltage of $V_{CCR}$ was 3 volts, the desired voltage of $V_{CCP}$ would be approximately 4.5 volts. To achieve this target, the control circuit turns on the charge pump 120 when $V_{CCP}$ reaches 4 volts and turns off the charge pump 120 when $V_{CCP}$ reaches 5 volts.

The maximum value of $V_{CCP}$ can be controlled by manipulating the "trip point" at which the clamp circuit 210 triggers the voltage regulator 220 to activate the charge pump for $V_{CCP}$. The trip point is controlled by the series of diodes 305, 307, 309, 311, and 313. In one embodiment of the invention, the diodes 305, 307, 309, 311, and 313 are implemented through a combination of PMOS/NMOS transistors. Decreasing the number of diodes in the series limits the voltage at the node 319, and thereby limits the maximum value of $V_{CCP}$. However, because a high $V_{CCP}$ is desired for use in the manufacturer's testing, yet a lower $V_{CCP}$ is preferable for user testing, the number of diodes are adjustable in accordance with the present invention.

The clamp circuit 210 operates to limit the voltage at the node 319, which is the voltage at the gate of the transistor 321. At low values of $V_{CCR}$, the diodes 305, 307, 309, 311, and 313 are off. The diodes 305, 307, 309, 311, and 313 are long channel devices which turn on gradually. At low values of $V_{CCR}$, the diodes 305, 307, 309, 311, and 313 do not conduct. Because $V_{CCP}$ tracks $V_{CCR}$, the gate-drain voltage of the transistor 321 therefore remains low, keeping the transistor 321 off. As $V_{CCR}$ increases, the diodes 305, 307, 309, 311, and 313 slowly turn on to clamp the maximum voltage at the node 319 to the total voltage across the five diodes, or $5V_T$ where $V_T$ is the voltage drop of one diode (approximately 0.7 volts). This results in a fixed voltage at the node 319 which is connected to the gate of the transistor 321, while the voltage on the drain of the transistor 321 continues to rise. The magnitude of the gate-drain voltage increases and turns on the transistor 321. As discussed above, turning on the transistor 321 clamps the voltage $V_{CCP}$. The capacitors 315 and 319 act as buffers to prevent rapid change of the voltage at the node 319.

Figures 4, 4A:
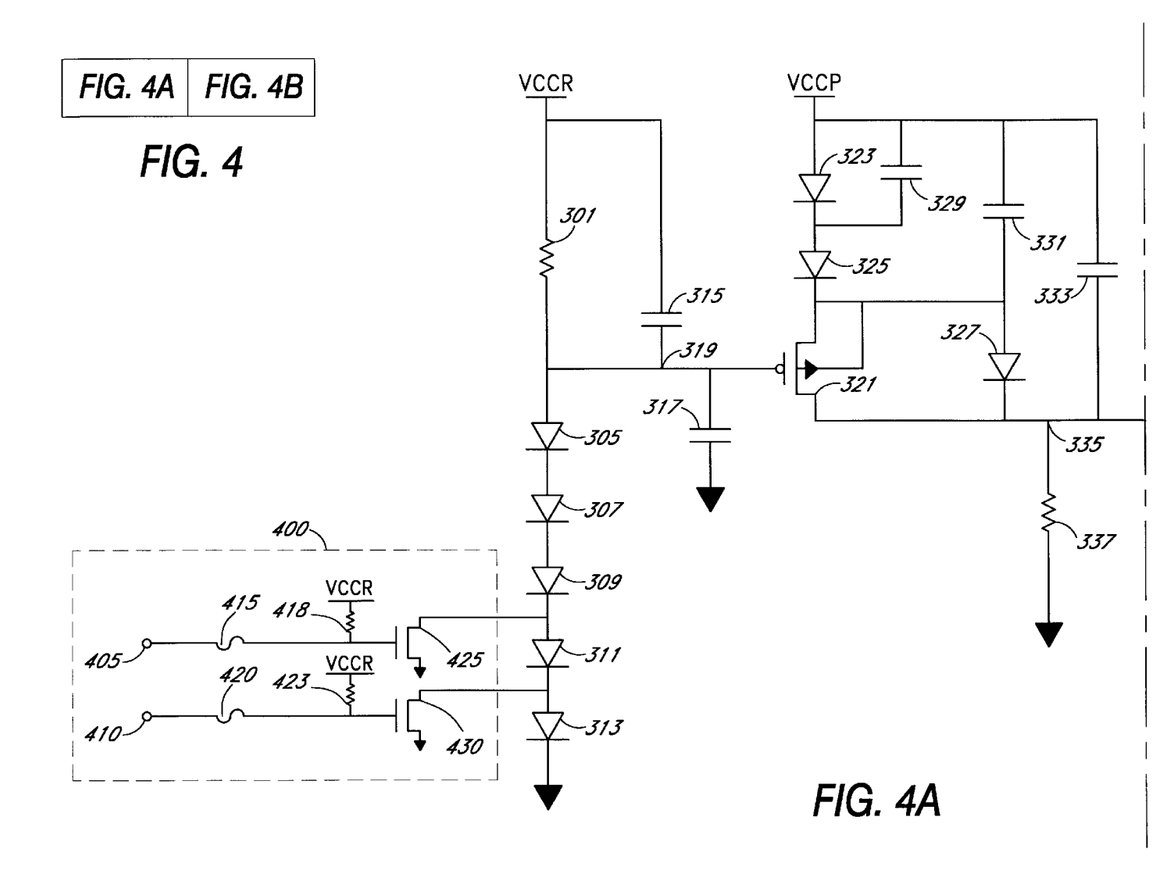
Figure 4B:
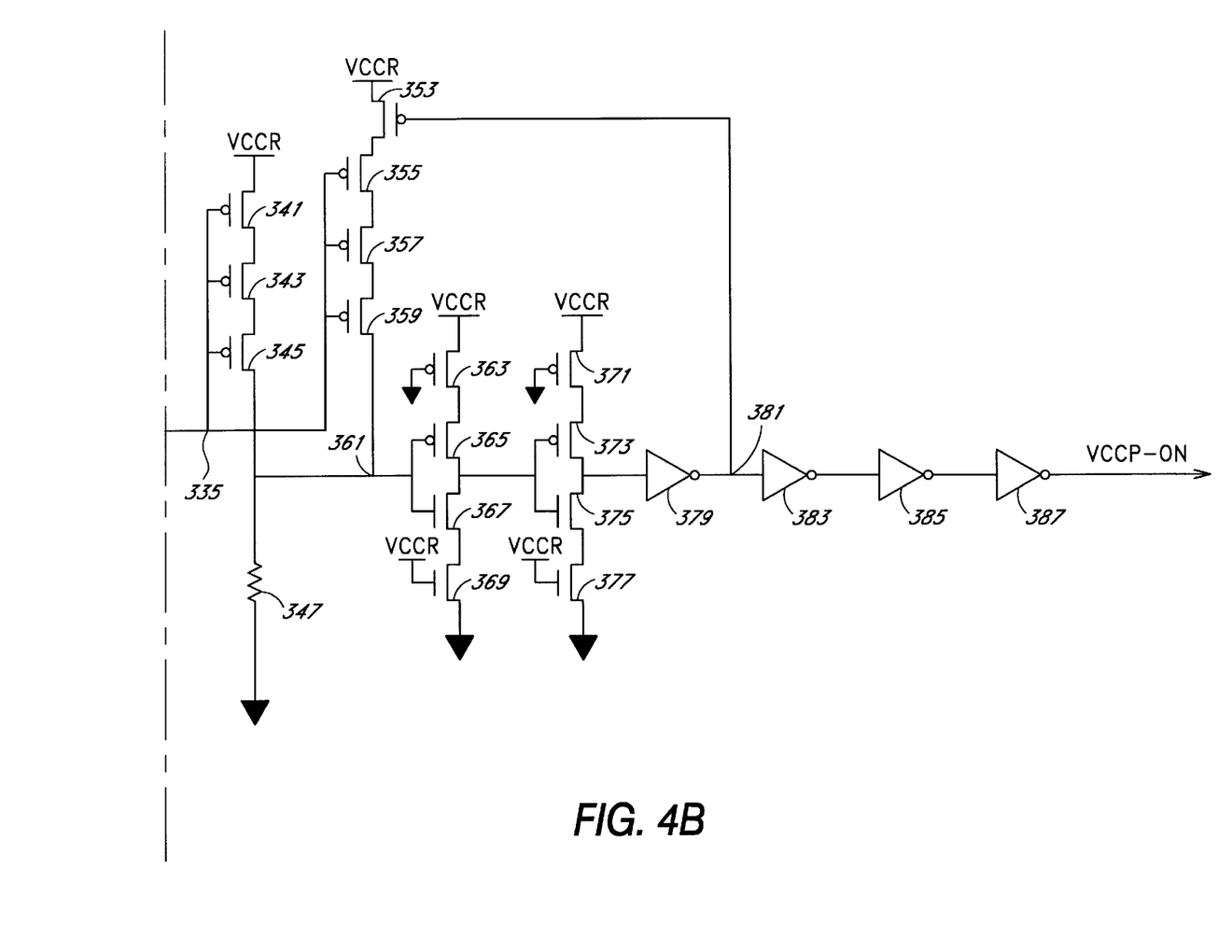

FIG. 4 (comprising FIGS. 4A and 4B) is a schematic diagram of the $V_{CCP}$ regulator circuit of FIG. 3 including a fuse control 400 to limit the voltage of $V_{CCP}$. The fuse control 400 comprises fuses 415, 420, resistors 418, 423, and transistors 425, 430. Although the fuse control 400 shows controls for two fuses 415 and 420, it can be appreciated that any number of fuses and controls may be used depending on the limits of $V_{CCP}$ desired. After manufacturing testing is completed, either or both of the fuses 415 and 420 may be blown. If both fuses 415 and 420 are blown, the diodes 311 and 313 are effectively removed from the circuit. This limits the voltage at the node 319 to $3V_T$, or 2.1 volts. By limiting the voltage at the node 319, the gate-drain voltage turns on the transistor 321 at a lower value of $V_{CCR}$. Therefore, the voltage control circuit 100 turns off the charge pump 120 at a lower value of $V_{CCR}$, thereby reducing the maximum value of $V_{CCP}$. If only fuse 420 is blown, only the diode 313 would be removed from the circuit. The voltage at the node 319 would then be limited to $4V_T$, or 2.8 volts. The 2.8 voltage limit would result in a maximum value of $V_{CCP}$ higher than the 2.1 voltage limit with two fuses blown, yet lower than the 3.5 voltage limit with no fuses blown.

The use of the fuse control 400 allows for flexibility in the design and testing of the semiconductor device. With the fuse control 400, the clamp circuit 210 may be constructed with many voltage control elements. This allows the supply voltage to reach a higher level before the clamp circuit 210 limits the supply voltage. However, once the circuit is ready to ship, the fuse control 400 bypasses one or more of the voltage control elements, thereby causing the clamp circuit 210 to limit the supply voltage at a lower voltage level. After the fuse control 400 bypasses one or more of the voltage control elements, the remainder of the circuit in FIG. 4 operates in the same manner as the circuit in FIG. 3.

Figure 5:
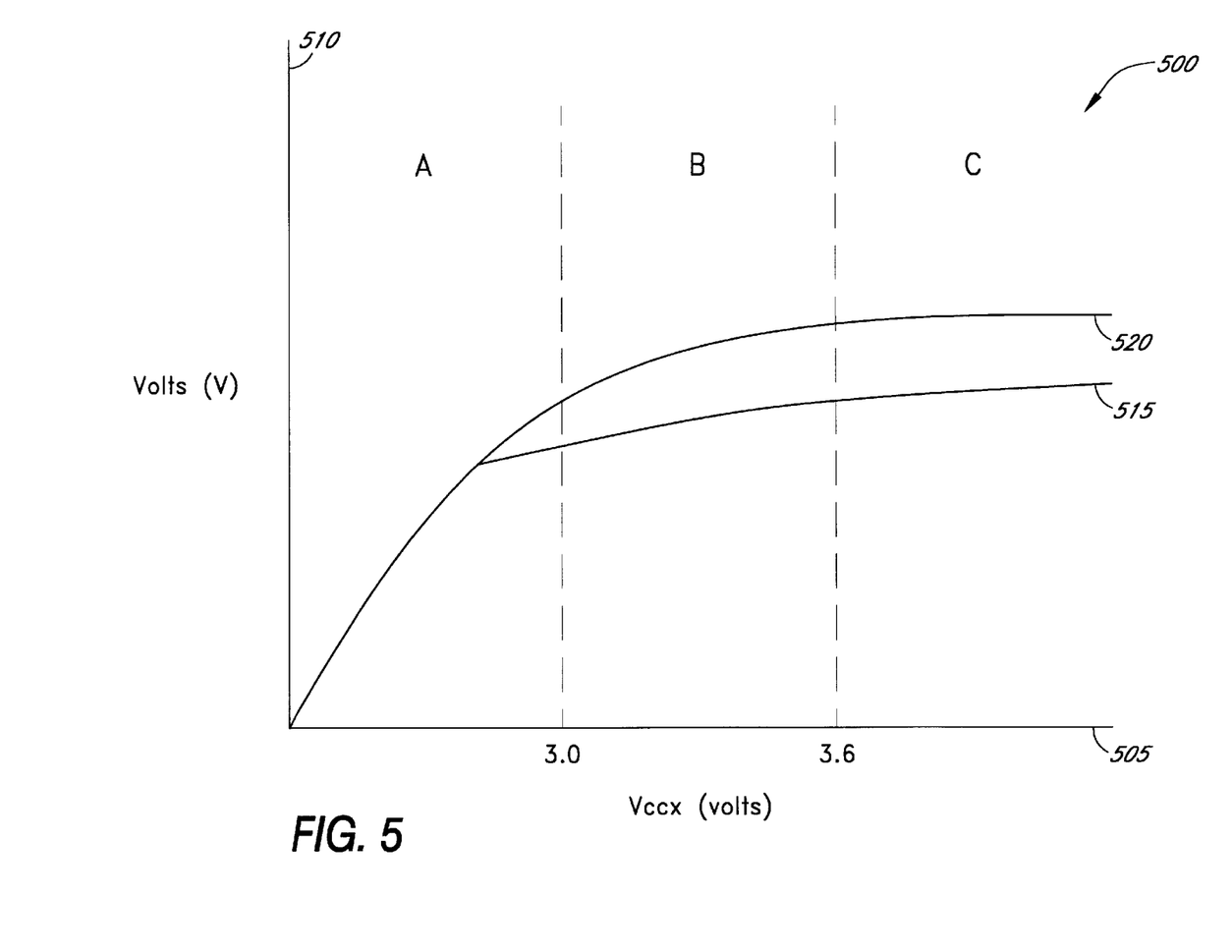
FIG. 5 is a graph showing the value of $V_{CCP}$ over a range of $V_{CCX}$ both without the fuse option and with the fuse option according to the present invention.

FIG. 5 is a graph 500 showing the value of $V_{CCP}$ over a range of $V_{CCX}$ both without the fuse control and with the fuse control according to the present invention. The line 520 represents the value of $V_{CCP}$ using the voltage control circuit 100 before the fuse control 400 is activated. The line 515 represents the value of $V_{CCP}$ using the voltage control circuit 100 after the fuse control 400 is activated. The graph 500 is divided into three separate sections. In section A, the semiconductor device is inoperable due to an undervoltage condition. In section B, the semiconductor device is in the specified operating range. In section C, the semiconductor device is in a test mode, such as burn in testing. The graph 500 illustrates that at low values of $V_{CCX}$, the lines 515 and 520 are the same. This is because the voltage of $V_{CCP}$ is not being limited by the clamp circuit. As the voltage of $V_{CCX}$ increases, the clamp circuit with the fuse control 400 activated begins to limit the voltage of $V_{CCP}$ as shown in line 515. The clamp circuit 210 keeps the value of $V_{CCP}$ lower for the fuse control 400 activated circuit throughout the upper range of $V_{CCX}$. Therefore, even if the customer attempts to test the semiconductor device at a high $V_{CCX}$ voltage, the voltage of $V_{CCP}$ remains clamped at a safe level.

Numerous variations and modifications of the invention will become readily apparent to those skilled in the art. Accordingly, the invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A method of providing a first supply voltage on a semiconductor device during a first period and a second supply voltage during a second period, the method comprising the steps of:

providing a plurality of voltage control elements, at least one voltage control element having a bypass circuit that can be selectively disabled by a bypass disable signal connected to the bypass circuit;

establishing a first voltage control signal from the voltage control elements by activating the bypass disable signal to disable the bypass circuit;

generating the first supply voltage in response to the first voltage control signal;

bypassing the at least one voltage control element by deactivating the bypass disable signal;

establishing a second voltage control signal in response to the plurality of voltage control elements which are not bypassed;

generating the second supply voltage from the second voltage control signal; and permanently disconnecting the bypass disable signal from the bypass circuit to permanently bypass the at least one voltage control element to thereby prevent the generation of the first supply voltage.

2. The method of claim 1, wherein the first supply voltage has a voltage magnitude greater than the second supply voltages.

3. The method of claim 1, wherein the plurality of voltage control elements comprise diodes.

4. The method of claim 1, wherein the at least one of the plurality of voltage control elements is bypassed using a fuse.

5. The method of claim 1, wherein the first supply voltage and the second supply voltage are generated by a charge pump.

6. The method of claim 1, wherein the plurality of voltage control elements limits the value of the voltage control signals.

7. The method of claim 1, wherein the at least one of the plurality of voltage control elements are bypassed after testing of the semiconductor device.

8. A voltage control circuit comprising:

a plurality of voltage regulation devices which limit an output voltage generated from an input voltage;

a voltage regulation circuit which receives the output voltage and generates a corresponding control signal;

a charge pump which receives the control signal and adjusts the voltage of a supply voltage based on the control signal; and at least one voltage limiting device coupled to a corresponding one of the plurality of voltage regulation devices, the voltage limiting device selectively bypassing the voltage regulation device in response to a first signal to limit the output voltage and selectively not bypassing the voltage regulation device in response to a second signal the voltage limiting device further being capable of permanently bypassing the voltage regulation device to thereby permanently limit the output voltage.

9. The voltage control circuit of claim 8, wherein the plurality of voltage regulation devices comprise diodes.

10. The voltage control circuit of claim 8, wherein the at least one voltage limiting device comprises a fuse.

11. The voltage control circuit of claim 8, wherein value of the supply voltage is reduced for each voltage regulation device bypassed.

12. The voltage control circuit of claim 8, wherein the charge pump turns on to increase the supply voltage and turns off to decrease the supply voltage.

13. A method of controlling a supply voltage in a semiconductor device, the method comprising the steps of:

providing an input voltage to a voltage regulator, the input voltage being limited by a plurality of voltage control elements;

establishing a target voltage of the input voltage;

adjusting a reference voltage when the input voltage reaches the target voltage;

setting a control signal based on the reference voltage;

generating the supply voltage based on the control signal;

selectively decreasing the target voltage to limit the voltage level of the supply voltage by selectively bypassing at least one of the plurality of voltage control elements; and permanently decreasing the target voltage to limit the voltage level of the supply voltage by permanently bypassing at least one of the plurality of voltage control elements.

14. The method of claim 13, wherein the supply voltage is generated by a charge pump.

15. The method of claim 13, wherein the at least one of the plurality of voltage control elements is bypassed using a fuse.

16. A voltage control circuit comprising:

a clamp circuit having a plurality of voltage regulation devices, the voltage regulation devices controlling a clamping threshold of the clamp circuit;

a voltage regulator electrically coupled to the clamp circuit, the voltage regulator generating a control signal responsive to the clamping threshold of the clamp circuit;

a charge pump electrically coupled to the voltage regulator, the charge pump generating a voltage in response to the control signal from the voltage regulator; and at least one bypass device connected to at least one of the plurality of voltage regulation devices, wherein the at least one bypass device is reversibly activated to reversibly bypass the at least one of the plurality of voltage regulation devices from the clamp circuit, thereby modifying the clamping threshold of the clamp circuit, wherein the bypass device comprises a fuse in series with a control terminal of a transistor and wherein the bypass device is reversibly activated by applying a control signal to the control terminal of the transistor via the fuse.

17. The voltage control circuit of claim 16, wherein the plurality of voltage regulation devices comprise diodes.

18. The voltage control circuit of claim 17, wherein the diodes are implemented through transistors.

19. The voltage control circuit of claim 16, wherein the bypass device is irreversibly activated by blowing the fuse to irreversibly bypass the at least one of the plurality of voltage regulation devices from the clamp circuit.

20. The voltage control circuit of claim 16, wherein the clamping threshold of the clamp circuit is reduced for each voltage regulation device bypassed.

21. The voltage control circuit of claim 16, wherein the voltage regulation devices limit the maximum voltage output of the clamp circuit.

* * * * *